(12) United States Patent
Jin et al.

(10) Patent No.: US 10,969,455 B2
(45) Date of Patent: Apr. 6, 2021

(54) TEST SYSTEM AND METHOD FOR TESTING A DEVICE UNDER TEST HAVING SEVERAL COMMUNICATION LANES

(71) Applicant: Rohde & Schwarz GmbH & Co. KG, Munich (DE)

(72) Inventors: Yi Jin, Singapore (SG); Kok Meng Wong, Singapore (SG); Johann Tost, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 123 days.

(21) Appl. No.: 16/162,149

(22) Filed: Oct. 16, 2018

(65) Prior Publication Data
US 2020/0116812 A1    Apr. 16, 2020

(51) Int. Cl.
*G01R 35/00* (2006.01)
*G01R 31/319* (2006.01)

(52) U.S. Cl.
CPC ..... *G01R 35/002* (2013.01); *G01R 31/31905* (2013.01)

(58) Field of Classification Search
CPC .......... H01L 23/49827; G01R 1/07342; G01R 1/0675; G01R 1/06711; G01R 1/07307; G01R 31/2893; G01R 31/2887; G01R 1/06722; G01R 1/07371; G01R 31/2886; G01R 1/0483; G01R 1/07378; G01R 1/0466; G01R 31/2851; G01R 1/44; G01R 31/31717; G01R 31/31924; G01R 19/00; G01R 1/06738; G01R 31/26; G01R 31/28; G01R 31/2889; G01R 31/3171; G01R 31/3183; G01R 31/3185; G01R 31/318505; G01R 31/386; G01R 1/0416; G01R 1/06744; G01R 1/07328; G01R 31/2808; G01R 31/3004; G01R 31/31855; G01R 31/31858; G01R 31/31907; G01R 31/3177; G01R 31/318558; G01R 31/318555; G01R 31/318536; G01R 31/318544; G01R 31/318563; G01R 31/318572; G01R 31/318533; G01R 31/31703; G01R 31/31708; G01R 31/31712;
(Continued)

(56) References Cited

U.S. PATENT DOCUMENTS

| 6,856,126 B2 * | 2/2005 | McTigue | G01R 1/06766 324/149 |
| 7,275,197 B2 * | 9/2007 | Inaba | G01R 31/3167 702/117 |

(Continued)

*Primary Examiner* — Vinh P Nguyen
(74) *Attorney, Agent, or Firm* — Christensen O'Connor Johnson Kindness PLLC

(57) ABSTRACT

A test system for testing a device under test that includes several communication lanes is described. The test system is a communication lane test system that includes a measurement instrument and a connecting interface for connecting the device under test, wherein the connecting interface is configured to connect at least two of the several communication lanes with the measurement instrument. The measurement instrument includes s a processor being configured to conduct an automatic conformance test on the at least two communication lanes concurrently. Moreover, a method for testing a device under test that includes s several communication lanes is described.

16 Claims, 2 Drawing Sheets

(58) Field of Classification Search
CPC ........ G01R 31/31716; G01R 31/31813; G01R 31/31908; G01R 31/31713; G01R 31/31905; G01R 31/281; G01R 31/2815; G01R 31/3167; G01R 31/3172; G01R 31/318561; G01R 31/31917; G01R 31/31926; G01R 1/06772; G01R 31/3012; G01R 31/31722; G01R 31/31724; G01R 31/31727; G01R 31/318335; G01R 35/00; G01R 35/02; G06F 21/81; G06F 11/00; G06F 11/2221; G06F 11/263; G06F 11/26; G06F 11/2733; G06F 11/3688; G06F 11/3006; G06F 11/3027; G06F 11/3051; G06F 13/287; G06F 13/4282; H04B 17/17; H04B 17/20; G05B 19/042; H04L 43/50; H04L 63/14; H04L 63/1416; H04L 1/24; H04L 1/244; H04L 69/03

See application file for complete search history.

(56) References Cited

U.S. PATENT DOCUMENTS

| | | | | |
|---|---|---|---|---|
| 7,899,638 B2 * | 3/2011 | Miller | ................ | G01R 31/3171 324/620 |
| 8,504,883 B2 * | 8/2013 | Huang | ................... | G11C 29/26 714/719 |
| 8,674,713 B2 * | 3/2014 | Miyazaki | ............... | G01R 13/02 324/750.01 |
| 8,694,276 B2 * | 4/2014 | Sontakke | ......... | G01R 31/31917 702/119 |
| 8,892,387 B2 * | 11/2014 | Bruzzano | ....... | G01R 31/318555 702/120 |
| 9,423,422 B2 * | 8/2016 | Brush, IV | ................ | G01R 1/20 |
| 9,843,493 B2 * | 12/2017 | Baeder | .................... | H04L 43/14 |
| 10,348,551 B2 * | 7/2019 | Sasaki | .................... | H04L 43/08 |
| 2008/0197867 A1 * | 8/2008 | Wokhlu | ............. | G01R 1/0416 324/756.02 |
| 2013/0090885 A1 | 4/2013 | Baeder et al. | | |

* cited by examiner

TEST SYSTEM AND METHOD FOR TESTING A DEVICE UNDER TEST HAVING SEVERAL COMMUNICATION LANES

FIELD OF THE DISCLOSURE

Embodiments of the present disclosure relate generally to a test system for testing a device under test as well as to a method for testing a device under test.

BACKGROUND

Conformance tests of a device under test having several communication lanes, for example conformance tests of devices communicating via Ethernet, usually are very time-consuming as the individual communication lanes have to be manually tested one by one, namely in a subsequent manner wherein manual interaction is required.

In some embodiments, the user needs to go through the test setup procedures for each communication lane individually. This setup procedure may include manually adjusting probe positions, consecutively connecting the individual communication lanes to a measurement instrument, and/or adjusting measurement parameters for each test of one of the several communication lanes. These manual adjustments are laborious and take quite a long time. Therefore, the costs for performing the respective conformance tests are high as the tests last longer and manual input is required so that the respective tests have to be observed.

Thus, there is a need for a test system as well as for a method for testing a device under test which allow for more cost-efficient, faster and less complicated conformance tests of a device under test that has several communication lanes.

SUMMARY

Embodiments of the present disclosure provide a test system for testing a device under test that comprises several communication lanes. The test system is a communication lane test system that comprises a measurement instrument and a connecting interface for connecting the device under test, wherein the connecting interface is configured to connect at least two of the several communication lanes with the measurement instrument. The measurement instrument comprises a processor being configured to conduct an automatic conformance test on the at least two communication lanes concurrently.

The test system is configured to automatically test the at least two of the several communication lanes simultaneously without further intervention by a user. Thus, the conformance test of the device under test is sped up and considerably simplified, as the user does not have to manually adapt the measurement setup between the conformance tests of the different communication lanes. Put another way, test cycles for a device under test are sped up and manual steps are removed so that the user may start a test procedure and wait for the completion of the overall test procedure comprising several individual tests of different communication lanes or rather communication pairs assigned to test cases. In other words, the test procedure may comprise several tests cases used for testing the different communication lanes of the device under test.

The device under test may be any device, electronic component, hardware or the like that is configured to communicate with other devices, electronic components, hardware or the like via the communication lanes.

For example, the device under test may be established as and/or comprise Ethernet hardware such as a router, a switch, a repeater, an Ethernet cable and/or a network adapter. In some embodiments, the device under test may be configured for high bandwidths, for example more than 1 GBit/s, and in some embodiments more than 10 GBit/s, and thus it may comprise at least four communication lanes.

Alternatively or additionally, at least some of the communication lanes may be part of an integrated circuit of the device under test. The several communication lanes each may comprise a physical layer for executing a communication protocol, for example Ethernet hardware, a physical interface such as D-PHY and/or PCI-E. However, the device under test may comprise any other type of suitable hardware employed for communication.

The device under test may be configured to employ single-ended signaling or differential signaling. Thus, the communication lanes may each either comprise a single conductor carrying a signal with reference to ground or two conductors that carry a differential pair of signals.

According to one aspect of the disclosure, the connecting interface is configured to connect all communication lanes of the device under test to the measurement instrument. Therefore, the user does not need to manually reorganize the connections of the individual communication lanes to the measurement instrument after the conformance test of some of the communication lanes is done (test case). Instead, the conformance test of all communication lanes, namely all test cases of the test procedure, can be performed automatically and consecutively for groups of at least two communication lanes at a time or for all communication lanes simultaneously.

According to a further aspect of the disclosure, the processor is configured or suitably programmed to conduct the automatic conformance test on all communication lanes concurrently. In other words, after the device under test is connected to the connecting interface and the test procedure is started, the conformance test of all communication lanes is performed automatically and simultaneously without further intervention of the user. Thus, a test system capable of particularly fast and simple conformance testing of the device under test is provided.

The measurement instrument may be established as an oscilloscope. The oscilloscope may comprise several input channels, at least one of which input channels may be connected to the connecting interface. Put another way, the at least one input channel of the oscilloscope is connectable to the device under test via the connecting interface.

The connecting interface may comprise a switch or other switching means configured to selectively connect at least two of the several communication lanes with the measurement instrument. If the measurement instrument is established as an oscilloscope the switch or other switching means may be configured to selectively connect at least two of the several communication lanes with at least one of the input channels of the oscilloscope.

In an embodiment of the disclosure, the measurement instrument is configured to conduct the automatic conformance test in at least one of real time and post-processing.

If the measurement instrument is configured to conduct the automatic conformance test in real time, result data generated by the processor or rather data acquired during the real time conformance test may be stored on a storage medium of the measurement instrument, output to the user on a display and/or forwarded to another device such as a computer, a laptop, a smartphone or another kind of smart device, e.g. for further processing and/or analysis. The result data may comprise visual hints whether the conformance test has been passed or not, e.g. in the form of a traffic light color code, tables with values of measured data and/or diagrams showing the development of operational parameters of the device under test that are indicative of the performance of the individual communication lanes.

If the measurement instrument is configured to conduct the automatic conformance test in post-processing, data measured during the conformance test is stored on a storage medium of the measurement instrument, for instance an internal storage medium such as an acquisition storage, and analyzed afterwards, and in some embodiments by the processor. The data resulting from this analysis may then be processed as described above for the case of real-time testing.

The test system may comprise a control unit being configured to control at least one of the processor and the device under test. For example, the control unit may control the processor and/or the device under test to enter a certain operational mode such as a sending mode and/or a receiving mode. In some embodiments, the control unit may be configured to control the device under test to generate a predefined test signal in at least one communication lane, which test signal is then analyzed by the processor. The test signal has a predefined duration and/or shape. Such predefined test signals allow conformance tests with repeatable conditions, such that a standardized conformance test is provided.

According to another aspect of the disclosure, the connecting interface is established by a separately formed test fixture connected to the measurement instrument. Thus, the test fixture is established as kind of an add-on part to the measurement instrument, wherein the test fixture may be adapted to be compatible with a specific device under test or to be comfortable with several different devices under test. Put another way, the test fixture works as an adapter that enables the measurement instruments to test several of the communication lanes of the device under test at once. Accordingly, the same measurement instrument may be used for conformance testing of different devices under test, albeit possibly with different test fixtures attached to the measurement instrument.

Alternatively, the connecting interface is established at the measurement instrument directly. In some embodiments, the connecting interface is part of the measurement instrument. In this particular embodiment, the measurement instrument is configured to conduct the automatic conformance test of the communication lanes of the device under test without a need for additional parts and/or adapters, as the communication lanes can be connected with the measurement instrument directly. This particular embodiment may be relevant for certain devices under test having different communication lanes according to a specific standard.

In an embodiment of the disclosure, the connecting interface comprises a lane connecting element being configured to at least one of connect several of the communication lanes with the measurement instrument and to connect several of the communication lanes with each other. In some embodiments, the lane connecting element is configured to merge signals propagating in the several communication lanes into a certain number of lines connecting the connecting interface with the measurement instrument, wherein the certain number of these lines may be smaller than the number of communication channels. For example, the signals may be merged into one or two lines connecting the connecting interface with input channels of the measurement instrument. As one or two is a typical number of input channels of measurement instruments such as oscilloscopes, the input channels of the measurement instrument are optimally utilized.

In some embodiments, the number of lines connecting the measurement instrument with the connecting interface equals the number of input channels of the measurement instrument.

In another embodiment of the disclosure, the connecting interface comprises at least one of a load element and a terminating element for each of the several communication lanes. The load elements and terminating elements may be employed used to apply a signal to the communication lanes and to terminate a signal traveling in the communication lanes, respectively.

The connecting interface may comprise a probe element for several of the communication lanes, each of the probe elements being configured to receive a signal propagating in the respective communication lane and to forward the received signal to the measurement unit. Moreover, the at least one probe element also may be configured to generate a test signal and to feed at least one of the communication lanes with the test signal. The form, size and functionality of the at least one probe element or rather the probe elements may differ depending on the field of application. For example, the probe elements are established as probe pads, probe pins, male connectors and/or female connectors.

According to another aspect of the disclosure, a device under test is provided that comprises several communication lanes, at least two of the several communication lanes of the device under test being connected to the measurement instrument by the connecting interface, and the measurement instrument comprising a processor being configured to conduct an automatic conformance test on the at least two communication lanes concurrently. With regard to possible variants and/or embodiments of the device under test, reference is made to the explanations given above.

In an embodiment of the disclosure, the connecting interface connects all communication lanes of the device under test to the measurement instrument. Thus, the conformance test of all communication lanes can be performed automatically and consecutively for groups of at least two communication lanes (pairs) at a time or for all communication lanes simultaneously.

The measurement instrument may be configured to perform predefined variants of conformance tests on the at least two communications lanes concurrently. For example, several different kinds of conformance tests or rather test procedures may be stored in a storage medium of the measurement instrument and may be chosen from. Accordingly, a user may select a certain kind of conformance test or rather test procedure, comprising several tests on different communication lanes. Once the user has selected the respective kind of conformance test or rather test procedure, the several tests are performed automatically without any further manual input.

In general, the test procedure is a test cycle that is started once so that the respective individual tests assigned to the test cycle are conducted automatically without any manual input. In other words, several pairs or rather different communication lanes may be tested subsequently or rather simultaneously.

The connection interface, however, ensures that all pairs or rather communication lanes can be connected concurrently with the measurement instrument.

Alternatively or additionally, the measurement instrument may be configured to automatically recognize the device under test when it is connected to the measurement instrument and may automatically preselect and/or conduct a suitable conformance test or rather test procedure for the particular device under test.

Embodiments of the present disclosure also provide a method for testing a device under test that comprises several communication lanes, comprising the following steps: a measurement instrument and a device under test with several communication channels are provided; the several communication channels are connected to the measurement instrument via a connecting interface; and an automatic conformance test is conducted on the several communication lanes concurrently via the measurement instrument.

Thus, a method capable of a particularly fast and simple conformance testing of the device under test is provided. Regarding the further advantages, reference is made to the explanations given above. The automatic conformance test that is conducted relates to a test procedure comprising several individual tests.

The connecting interface may be established by a separately formed test fixture that is interconnected between the device under test and the measurement instrument. Thus, the test fixture is established as an add-on part to the measurement instrument, namely an additional hardware component, wherein the test fixture may be adapted to be compatible with a specific device under test or to be compatible with several different devices under test. Put another way, the test fixture works as an adapter being interconnected between the device under test and the measurement instrument such that several of the communication lanes of the device under test can be tested at once.

Generally, the communication lane(s) in some embodiments may comprise two twisted conductor pairs. Hence, the communication lane(s) may be provided by so-called twisted-pair cabling which is a type of wiring in which two conductors of a single circuit are twisted together so that electromagnetic compatibility is improved.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
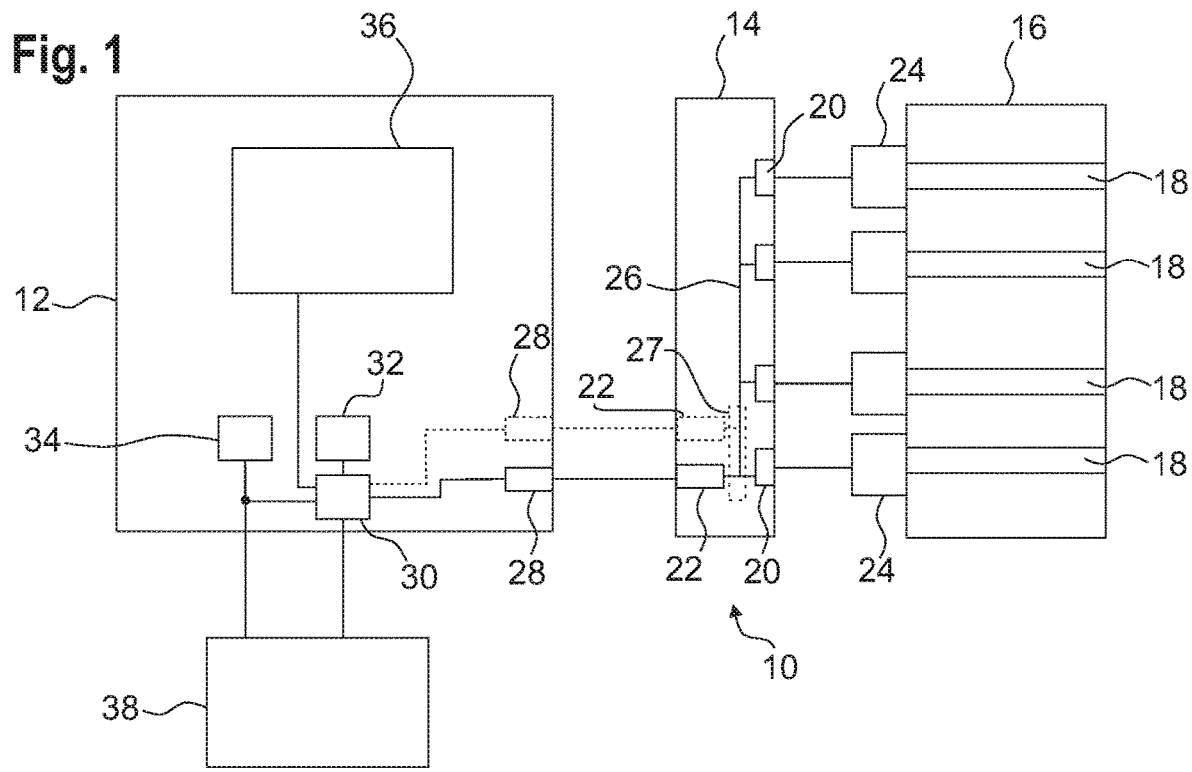
FIG. 1 schematically shows a first embodiment of a test system according to the disclosure.

FIG. 1 schematically shows a test system 10 comprising a measurement instrument 12, a connecting interface 14 and a device under test 16 that comprises several communication lanes 18. The several communication lanes 18 are depicted as channels in FIG. 1 for illustrating purposes.

The measurement instrument 12 and the connecting interface 14 together form the testing system 10 that is configured to perform an automatic conformance test of the several communication lanes 18, also called test procedure, which will be explained in more detail below.

The device under test 16 may be any device, electronic component, hardware or the like that is configured to communicate with other devices, electronic components, hardware or the like via the communication lanes 18.

For example, the device under test 16 may be established as and/or comprise Ethernet hardware components such as a router, a switch, a repeater, an Ethernet cable and/or a network adapter. In some embodiments, the device under test 16 may be configured for high bandwidths, for example more than 1 GBit/s, and in some embodiments more than 10 GBit/s, and thus may comprise at least four communication lanes 18.

Alternatively or additionally, at least some of the communication lanes 18 may be part of an integrated circuit (IC) of the device under test 16. For example, the integrated circuit is configured for inter-chip communication between at least two computer chips of the device under test 16.

In some embodiments, the several communication lanes 18 each may comprise a physical layer for executing a communication protocol, for example Ethernet hardware, a physical interface such as D-PHY and/or PCI-E. However, the device under test 16 may comprise any other type of suitable hardware employed for communication.

The device under test 16 may employ single-ended signaling or differential signaling. Thus, the communication lanes 18 may each either comprise a single conductor carrying a signal with reference to ground or two conductors that carry a differential pair of signals, which two conductors may be twisted together.

The conductors may be at least one of an electric current conductor such as a metal wire and electromagnetic wave conductor such as an optical fiber. Accordingly, the communication lanes 18 are configured to transmit electrical and/or optical signals.

The connecting interface 14 comprises several input elements 20, at least one output element 22, several probe elements 24 and a connecting element 26.

In the embodiment shown in FIG. 1, the connecting interface 14 is established by a separately formed test fixture connected to the measurement instrument 12. Thus, the connecting interface 14 relates to a hardware component such as an adapter.

The probe elements 24 are each allocated to one of the communication lanes 18 and are connected to the respectively allocated communication lane 18 in a signal transmitting manner such that the probe elements 24 can receive a signal propagating in the respective communication lane 18 and/or generate and apply a signal to the respective communication lane 18.

The form, size and functionality of the probe elements 24 may differ depending on the field of application. In some embodiments, the probe elements 24 are adapted to be compatible with the respective device under test 16 and can be connected to the communication lanes 18. For example, the probe elements 24 are established as probe pads, probe pins, male connectors and/or female connectors.

The probe elements 24 are each connected to one of the input elements 20. The input elements 20 are each connected to the at least one output element 22 by the connecting element 26.

As indicated by the dashed lines in FIG. 1, if the connecting interface 14 comprises several output elements 22, the input elements 20 each may be connected to one or several of the output elements 22.

Additionally or alternatively, the connecting interface 14 may comprise a switch or other switching means 27 being configured to selectively connect each of the input elements 20 with at least one of the output elements 22.

The measurement instrument 12 comprises at least one input channel 28, a processor 30 being connected to the at least one input channel 28 in a signal transmitting manner and a control unit 32 being connected to the processor 30 and/or to the input channel 28. In some embodiments, the control unit 32 can be implemented in hardware, software or a combination of hardware and software.

The input channel 28, is connected to the at least one output element 22 of the connecting interface 14 in a signal transmitting manner such that a signal transmitting connection is established between the communication lanes 18 and the processor 30. Moreover, a signal transmitting connection may be established between the device under test 16 and the control unit 32.

The control unit 32 is configured to control at least one of the processor 30 and the device under test 16. For example, the control unit 32 may control the processor 30 and/or the device under test 16 to enter a certain operational mode such as a sending mode and/or a receiving mode. In some embodiments, the control unit 32 may be configured to control the device under test 16 to generate a predefined test signal in at least one of the communication lanes 18.

Figure 2:
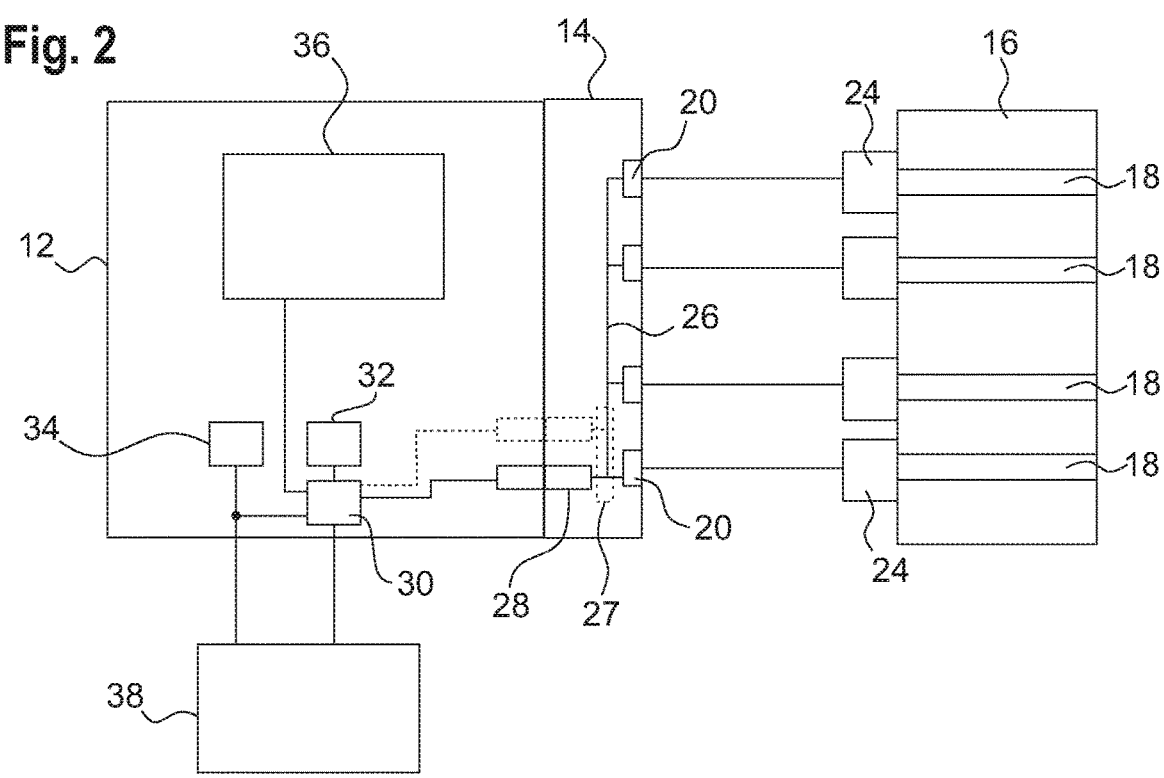
FIG. 2 schematically shows a second embodiment of a test system according to the disclosure.

The embodiment of the test system 10 shown in FIG. 2 differs from the embodiment shown in FIG. 1 in that the connecting interface 14 is established at the measurement instrument 12 directly. In some embodiments, the connecting interface 14 may be part of the measurement instrument 12.

Accordingly, the at least one output element 22 of the connecting interface 14 may be directly connected with the processor 30 and/or the control unit 32.

Figure 3:
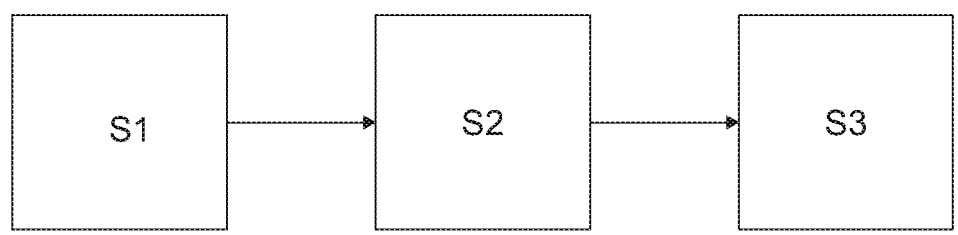
FIG. 3 schematically shows a flow chart of a representative method for testing a device under test according to the disclosure.

In all embodiments, the test system 10 is configured to perform a method for testing the device under test 16, which method is described below with reference to FIG. 3.

First, test signals propagating in the communication lanes 18 of the device under test 16 are received by the probe elements 24 (step S1). In step S1, the control unit 32 may control the device under test 16 to generate the test signals with predefined properties such that the test signals each have a predefined duration and/or shape.

The test signals are then forwarded to the measurement instrument 12 (step S2), via the input elements 20, the connecting element 26 and the at least one output element 22. More specifically, the test signals are forwarded to the processor 30.

The processor 30 conducts a conformance test of each of the several communication lanes automatically and concurrently (step S3), wherein the conformance test is performed based on the received test signals in real time and/or in post-processing. The respective conformance test may relate to a test procedure.

If the conformance test is conducted in real time, result data generated by the processor 30 during the real-time conformance test may be stored on a storage medium of the measurement instrument 12, output on a display 36 and/or forwarded to another device 38 such as a computer, a laptop, a smartphone or another kind of smart device, e.g. for further processing and/or analysis.

For the conformance test, the processor 30 may be suitably programmed or configured to detect certain events in the received test signals. In some embodiments, the processor 30 may be configured to apply predefined trigger conditions to the test signals in order to detect the certain events.

The result data may comprise visual hints whether the conformance test has been passed or not, e.g. in the form of a traffic light color code, tables with values of measured data and/or diagrams showing the development of operational parameters of the device under test 16 that are indicative of the performance of the individual communication lanes 18.

If the conformance test is conducted in post-processing, the received test signals may be processed, and in some embodiments by the processor 30, and stored on the storage medium 34 of the measurement instrument 12. For example, the received test signals may be digitized to generate result data samples. Moreover, information about whether certain trigger conditions have been met, e.g. an edge trigger condition, may be added to the result data samples.

The result data samples are analyzed afterwards, and in some embodiments by the processor 30. The data resulting from this analysis may then be processed as described above for the case of real-time testing.

As all communication lanes 18 are connected to the processor 30, an automatic and simultaneous conformance test of all communication lanes 18 is performed.

The measurement instrument 12, and in some embodiments the processor 30, may be configured to perform predefined variants of conformance tests on the communications lanes 18 concurrently. For example, several different kinds of conformance tests may be stored on the storage medium 34 of the measurement instrument 12 and may be chosen from.

Alternatively or additionally, the measurement instrument 12, and in some embodiments the processor 30, may be configured to automatically recognize the device under test 16 when it is connected to the measurement instrument 12 and may automatically preselect and/or conduct a suitable conformance test for the particular device under test 16.

The control unit 32 may include, in some embodiments, logic for implementing the technologies and methodologies described herein. This logic of the control unit 32 can be carried out in either hardware or software, or a combination of hardware and software. In some embodiments, the control unit 32 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 32 includes a microprocessor and a memory storing logic modules and/or instructions. In an embodiment, the control unit 32 includes one or more ASICs having a plurality of predefined logic components. In an embodiment, the control unit 32 includes one or more FPGA having a plurality of programmable logic components. In an embodiment, the control unit 32 includes hardware circuit implementations (e.g., implementations in analog circuitry, implementations in digital circuitry, and the like, and combinations thereof). In an embodiment, the control unit 32 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test system for testing a device under test that comprises several communication lanes, the test system being a communication lane test system that comprises: a measurement instrument and a connecting interface for connecting the device under test, the connecting interface being configured to connect at least two of the several communication lanes with the measurement instrument, and the measurement instrument comprising a processor being configured to conduct an automatic conformance test on the at least two communication lanes concurrently, wherein the processor is configured to conduct the automatic conformance test on the at least two communication lanes individually, wherein the connecting interface comprises a switch being configured to selectively connect at least two of the several communication lanes with the measurement instrument.

2. The test system of claim 1, wherein the connecting interface is configured to connect all communication lanes of the device under test to the measurement instrument.

3. The test system of claim 2, wherein the processor is configured to conduct the automatic conformance test on all communication lanes concurrently.

4. The test system of claim 1, wherein the measurement instrument is established as an oscilloscope.

5. The test system of claim 1, wherein the measurement instrument is configured to conduct the automatic conformance test in at least one of real time and post-processing.

6. The test system of claim 1, comprising a control unit being configured to control at least one of the processor or the device under test.

7. The test system of claim 1, wherein the connecting interface is established by a separately formed test fixture connected to the measurement instrument.

8. The test system of claim 1, wherein the connecting interface is established at the measurement instrument directly.

9. The test system of claim 1, wherein the connecting interface comprises a lane connecting element being configured to at least one of connect several of the communication lanes with the measurement instrument and to connect several of the communication lanes with each other.

10. The test system of claim 1, wherein the connecting interface comprises at least one of a load element or a terminating element for each of the several communication lanes.

11. The test system of claim 1, wherein the connecting interface comprises a probe element for several of the communication lanes, each of the probe elements being configured to receive a signal propagating in the respective communication lane and to forward the received signal to the measurement unit.

12. The test system of claim 1, wherein a device under test is provided that comprises several communication lanes, at least two of the several communication lanes of the device under test being connected to the measurement instrument by the connecting interface, and the measurement instrument comprising a processor being configured to conduct an automatic conformance test on the at least two communication lanes concurrently.

13. The measurement system of claim 12, wherein the device under test comprises at least four communication lanes.

14. The measurement system of claim 12, wherein the connecting interface connects all communication lanes of the device under test to the measurement instrument.

15. A method for testing a device under test that comprises several communication lanes, comprising the following steps:
   providing a measurement instrument and a device under test with several communication channels;
   selectively connecting at least two of the several communication channels to the measurement instrument via a switch of a connecting interface; and
   conducting an automatic conformance test on the several communication lanes concurrently via the measurement instrument, wherein the automatic conformance test is conducted on the several communication lanes individually.

16. The method of claim 15, wherein the connecting interface is established by a separately formed test fixture that is interconnected between the device under test and the measurement instrument.

* * * * *